United States Patent
Zhu et al.

(10) Patent No.: US 10,672,486 B2
(45) Date of Patent: Jun. 2, 2020

(54) REFRESHING DATA STORED AT A MEMORY COMPONENT BASED ON A MEMORY COMPONENT CHARACTERISTIC COMPONENT

(71) Applicant: Micron Technology, Inc., Boise, ID (US)

(72) Inventors: Fangfang Zhu, San Jose, CA (US); Jiangli Zhu, San Jose, CA (US); Ying Yu Tai, Mountain View, CA (US)

(73) Assignee: MICRON TECHNOLOGY, INC., Boise, ID (US)

(*) Notice: Subject to any disclaimer, the term of this patent is extended or adjusted under 35 U.S.C. 154(b) by 0 days.

(21) Appl. No.: 16/107,878

(22) Filed: Aug. 21, 2018

(65) Prior Publication Data

US 2020/0066362 A1 Feb. 27, 2020

(51) Int. Cl.
| | |
|---|---|
| *G11C 16/34* | (2006.01) |
| *G11C 13/00* | (2006.01) |
| *G11C 29/52* | (2006.01) |
| *G11C 11/406* | (2006.01) |

(52) U.S. Cl.
CPC .... *G11C 16/3431* (2013.01); *G11C 11/40626* (2013.01); *G11C 13/0033* (2013.01); *G11C 13/0069* (2013.01); *G11C 29/52* (2013.01)

(58) Field of Classification Search
CPC .................. G11C 16/3431; G11C 13/0033
USPC ............................................ 365/185.02, 222
See application file for complete search history.

(56) References Cited

U.S. PATENT DOCUMENTS

| | | | | |
|---|---|---|---|---|
| 9,087,602 | B2* | 7/2015 | Youn | G11C 11/40615 |
| 9,236,110 | B2* | 1/2016 | Bains | G11C 11/40618 |
| 9,257,169 | B2* | 2/2016 | Jung | G11C 11/40622 |
| 9,299,428 | B2* | 3/2016 | Kim | G11C 13/0035 |
| 9,318,185 | B2* | 4/2016 | Kim | G11C 11/4082 |
| 9,396,786 | B2* | 7/2016 | Yoon | G11C 11/40611 |
| 9,514,798 | B2* | 12/2016 | Song | G11C 11/406 |
| 9,536,586 | B2* | 1/2017 | Sohn | G11C 11/406 |
| 9,711,234 | B1 | 7/2017 | Van Gaasbeck | |
| 9,881,682 | B1 | 1/2018 | Tang et al. | |
| 9,892,779 | B2* | 2/2018 | Kang | G06F 3/0619 |
| 10,083,737 | B2* | 9/2018 | Bains | G06F 13/1636 |
| 2017/0269992 | A1 | 9/2017 | Bandic et al. | |

(Continued)

FOREIGN PATENT DOCUMENTS

CN 104851455 A 8/2015

OTHER PUBLICATIONS

PCT International Search Report and Written Opinion for International Application No. PCT/US2019/046707, dated Dec. 5, 2019, 9 pages.

*Primary Examiner* — Son L Mai

(74) *Attorney, Agent, or Firm* — Lowenstein Sandler LLP

(57) ABSTRACT

One or more write operations are performed on a memory component. A determination is made as to whether a number of the plurality of write operations performed on the memory component since performance of a refresh operation on the memory component exceeds a threshold value. In response to determining that the number of write operations performed on the memory component exceeds the threshold value, a memory cell of the memory component is identified based on the plurality of write operations. Data stored at memory cells of the memory component that are proximate to the identified memory cell is refreshed.

18 Claims, 9 Drawing Sheets

(56) References Cited

U.S. PATENT DOCUMENTS

2017/0316826 A1 11/2017 Nakanishi
2019/0147941 A1* 5/2019 Qin .................... G11C 11/419
                 711/102

* cited by examiner

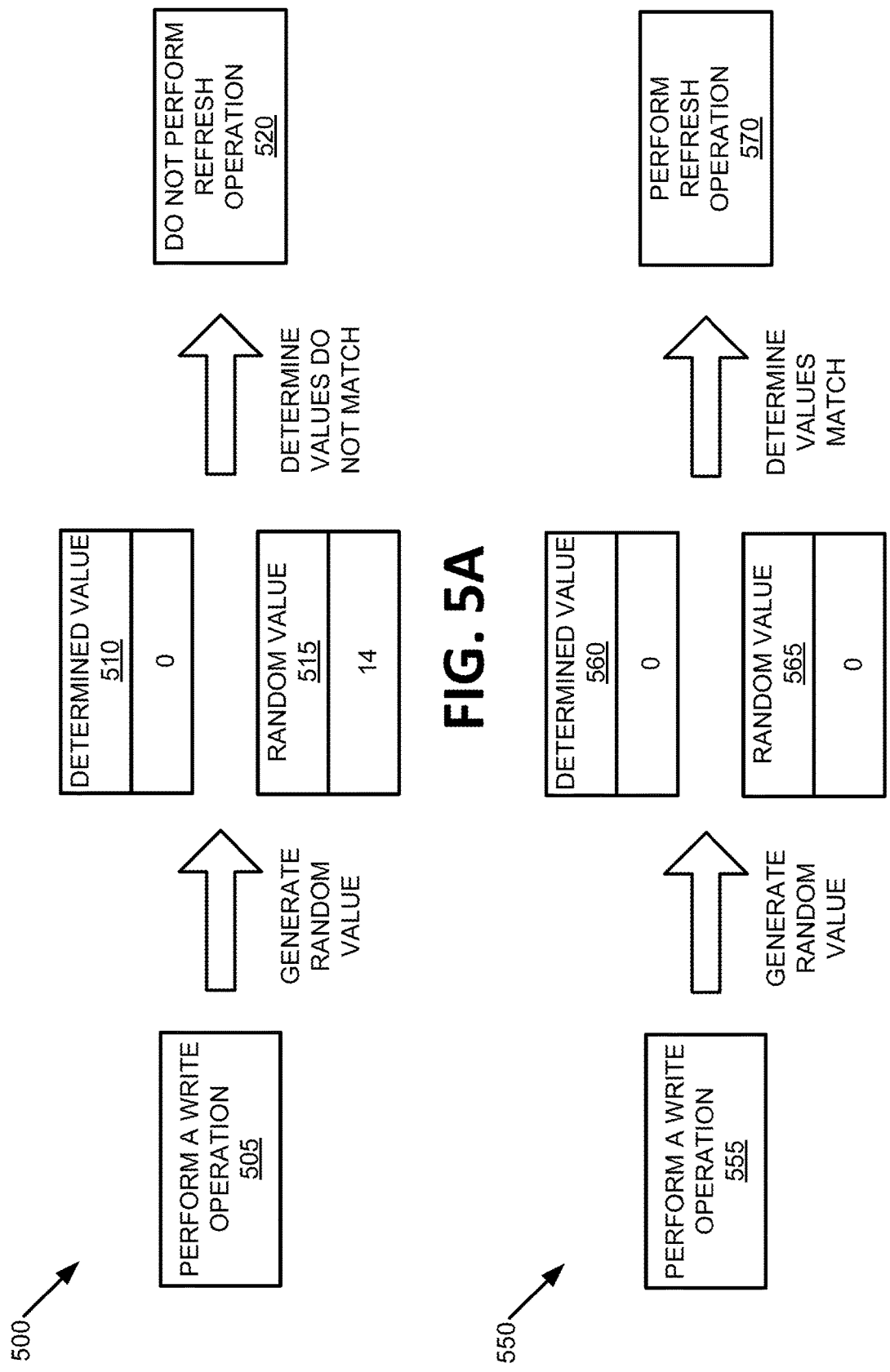

600

| MEMORY COMPONENT 605 | | | |
|---|---|---|---|
| DRIFT | TEMP. | THRESH. | WRITE OPS. |
| 5 | 125 | 100 | 100,000 |

| MEMORY COMPONENT 610 | | | |
|---|---|---|---|
| DRIFT | TEMP. | THRESH. | WRITE OPS. |
| 7 | 150 | 110 | 75,000 |

| MEMORY COMPONENT 630 | | | |
|---|---|---|---|
| DRIFT | TEMP. | THRESH. | WRITE OPS. |
| 18 | 120 | 130 | 50,000 |

| WRITE THRESHOLD 615 |
|---|
| 150,000 |

| TEMP. THRESHOLD 620 |
|---|
| 200 |

| DRIFT THRESHOLD 625 |
|---|
| 24 |

| MEMORY COMPONENT 605 | | | |
|---|---|---|---|
| DRIFT | TEMP. | THRESH. | WRITE OPS. |
| 8 | 125 | 50 | 151,000 |

| MEMORY COMPONENT 610 | | | |
|---|---|---|---|
| DRIFT | TEMP. | THRESH. | WRITE OPS. |
| 15 | 220 | 60 | 95,000 |

| MEMORY COMPONENT 630 | | | |
|---|---|---|---|
| DRIFT | TEMP. | THRESH. | WRITE OPS. |
| 25 | 110 | 70 | 60,000 |

| WRITE THRESHOLD 615 |
|---|
| 150,000 |

| TEMP. THRESHOLD 620 |
|---|
| 200 |

| DRIFT THRESHOLD 625 |
|---|
| 24 |

REFRESHING DATA STORED AT A MEMORY COMPONENT BASED ON A MEMORY COMPONENT CHARACTERISTIC COMPONENT

TECHNICAL FIELD

Embodiments of the disclosure relate generally to memory sub-systems, and more specifically, relate to refreshing data stored at a memory component based on a memory component characteristic component.

BACKGROUND

A memory sub-system can include one or more memory components, such as a cross point array, that stores data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various implementations of the disclosure.

FIG. 5A is an illustration of determining to not perform a refresh operation based on determining that a determined value and a random value do not match, in accordance with some embodiments of the disclosure.

FIG. 5B is an illustration of determining to perform a refresh operation based on determining that a determined value and a random value match, in accordance with some embodiments of the disclosure.

FIG. 6A illustrates determining whether to adjust the threshold value for performing a refresh operation on memory components of a memory sub-system, in accordance with an embodiment of the disclosure.

FIG. 6B illustrates adjusting the threshold value for performing a refresh operation on memory components of a memory sub-system, in accordance with an embodiment of the disclosure.

DETAILED DESCRIPTION

Figure 1:
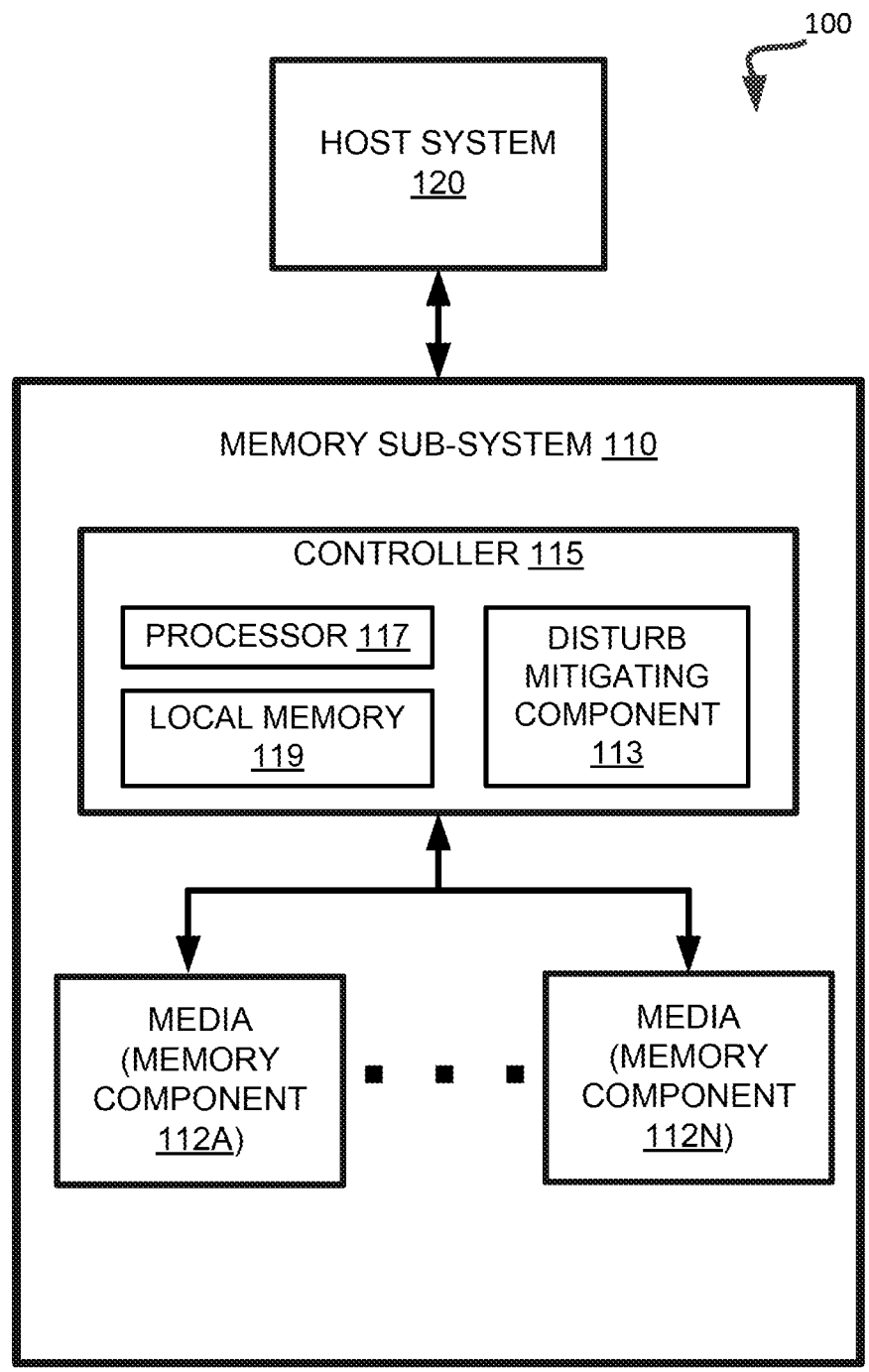
FIG. 1 illustrates an example computing environment that includes a memory sub-system in accordance with some embodiments of the present disclosure.

Aspects of the present disclosure are directed to refreshing data stored at a memory component based on one or more memory component characteristics. A memory sub-system is also hereinafter referred to as a "memory device." An example of a memory sub-system is a storage system, such as a solid-state drive (SSD). In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system.

A memory component of a conventional memory sub-system can include memory cells that can store one or more bits of binary data corresponding to data received from the host system. The memory component can be, for example, cross point array memory. When data is written to a memory cell of the cross point array memory component for storage, nearby or adjacent memory cells can experience what is known as write disturb. Write disturb is the result of continually writing data to a particular memory cell without writing and/or refreshing data stored at nearby memory cells, causing the nearby memory cells to change over time (e.g., the programmed state changes). If too many write operations are performed on the particular memory cell, data stored at adjacent or proximate memory cells of the memory component can become corrupted or incorrectly stored at the adjacent or proximate memory cell. Thus, a higher error rate can result when reading the data stored at the adjacent or proximate memory cells. The higher error rate can increase the use of an error detection and correction operation (e.g., an error control operation) for subsequent operations (e.g., read and/or write) performed on the memory cell. The increased use of the error control operation can result in a reduction of the performance of the conventional memory sub-system. As more resources of the memory sub-system are used to perform the error control operation, fewer resources can be used to perform other read operations or write operations. Thus, the performance of the memory sub-system can be decreased as fewer read operations and write operations can be performed within a particular amount of time.

To mitigate the effects of write disturb on data stored at the memory sub-system, conventional memory sub-systems typically store the number of write operations performed on managing units of the memory component as metadata on the memory component. A managing unit can be defined as a unit of user data that is managed and/or operated on by the memory component. For example, a managing unit can be a kilobyte (KB) of user data stored at the memory component. The number of write operations performed on a managing unit can be read from the metadata stored at the memory component and used to determine the disturb count for one or more of the portions (e.g., proximate memory cells) of the memory component. The disturb count can correspond to a number of write operations performed on a particular managing unit without an intervening write or refresh operation for the particular managing unit.

Once the disturb count exceeds a threshold number of write operations, the data of the managing unit of the memory component can be refreshed. However, in a cross-point array type memory, the managing units of the memory component can be relatively small and the number of write counts can be in the millions due to high endurance of the cross-point array type memory. The storing of the disturb count can result in a large amount of overhead of the memory sub-system being dedicated towards storing the number of write operations performed on managing units of the memory component. Furthermore, in a conventional memory sub-system, each time a write operation is performed on a particular managing unit, the metadata associated with the number of write operations for the particular managing unit is read from the memory component, incremented to reflect the recently performed write operation, and then the updated metadata is written back to the memory component. The process of maintaining the write count metadata is performed for each managing unit of the memory component. The performance of these operations each time a write operation is performed consumes a large amount of resources of the memory sub-system. Furthermore, a memory component can include hundreds of thousands of managing units. Maintaining the write count metadata for such a large number of managing units consumes a large amount of computing resources of the memory sub-system. This results in a decrease in the performance of the memory sub-system as well as less capacity of the memory sub-system being used to store user data.

Aspects of the present disclosure address the above and other deficiencies by refreshing data stored at a memory component at a frequency based on one or more characteristics associated with the memory component. As data is received from the host system and written to memory cells of the memory component, the number of write operations performed on the memory component is counted. Unlike a conventional memory sub-system which utilizes separate counts for write operations performed on each managing unit of a memory component, embodiments of the present disclosure can utilize a single count of write operations performed on the memory component rather than for each managing unit. Once the number of write operations exceeds a threshold value, a memory cell of the memory component is identified. The threshold value can be determined based on the probability of write disturb affecting the data stored at memory cells of the memory component after a particular number of write operations. For example, if there is a 0.01% probability of write disturb affecting the data stored at the memory cells of the memory component after 1000 write operations are performed without refreshing the data, then the threshold value can be a number of write operations that is less than 1000 write operations.

The probability of write disturb affecting the data stored at the memory cells can be based on one or more characteristics associated with the memory component. Examples of characteristics associated with the memory component can include the total number of write operations performed on the memory component, the temperature of the memory component, the drift time of data stored at the memory component, and die-to-die variance of the memory component.

When the number of write operations performed on the memory component exceeds the threshold value, a memory cell associated with the write operations performed on the memory component is identified. For example, the memory cell associated with the most recent write operation of the write operations performed on the memory component can be identified.

As previously discussed, when data is written to a memory cell, such as the identified memory cell, data stored at nearby memory cells can be affected by write disturb stress. Therefore, upon identifying the memory cell associated with the write operations, the data stored at one or more memory cells that are nearby (e.g., proximate to) the identified memory cell is refreshed. Refreshing the data stored at the one or more nearby memory cells can include reading the data from the one or more memory cells, then writing the data back to the one or more memory cells. By refreshing the data stored at the one or more memory cells, the effects of write disturb stress on the data stored at the one or more memory cells due to the write operation performed on the identified memory cell are mitigated. Once the data has been refreshed at the one or more memory cells, the count for the number of write operations performed on the memory component can be reset to 0 and subsequent operations (e.g., read or write operations) can be performed.

Advantages of the present disclosure include, but are not limited to, an increased reliability of data stored at the memory sub-system. For example, by refreshing data stored in nearby memory cells to a memory cell that has been recently written to, the effects of write disturb stress on the data stored in the nearby memory cells can be mitigated. Since the effects of write disturb stress on the data stored in the nearby cells is mitigated, the number of errors found in data stored at the memory sub-system is reduced. The reduced error rate associated with the data stored at the nearby memory cells can decrease the number of error correction operations that are performed by the memory sub-system and improve the performance of the memory sub-system. Furthermore, by utilizing a single write count for the memory component rather than utilizing write counts for each managing unit of the memory component, the amount of computing resources being dedicated to the tracking of write counts of the memory component is decreased. Additionally, utilizing a single write count for the memory component rather than utilizing write counts for each managing unit of the memory component reduces the amount of storage of the memory sub-system being dedicated to the storage of metadata corresponding to the write counts of each managing unit. Since less computing resources are being dedicated to the tracking of write counts, the computing resources can be used to perform other operations (e.g., reading and writing data) for a host system and the capacity of the memory sub-system to store data from the host system is increased. This results in an improvement in the performance of the memory sub-system.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a disturb mitigating component 113 that can be used to refresh data stored at a memory component at a frequency based on characteristics associated with the memory component. In some embodiments, the controller 115 includes at least a portion of the disturb mitigating component 113. For example, the controller 115 can include a processor 117 (processing device) configured to execute instructions stored in local memory 119 for performing the operations described herein. In some embodiments, the disturb mitigating component 113 is part of the host system 120, an application, or an operating system.

The disturb mitigating component 113 can determine whether a number of write operations performed on a memory component exceeds a threshold value. The disturb mitigating component 113 can identify a memory cell of the memory component in response to determining that the number of write operations performed exceeds the threshold value. The disturb mitigating component 113 can further refresh data stored at memory cells of the memory component that are proximate to the identified memory cell.

Further details with regards to the operations of the disturb mitigating component 113 are described below.

Figure 2:
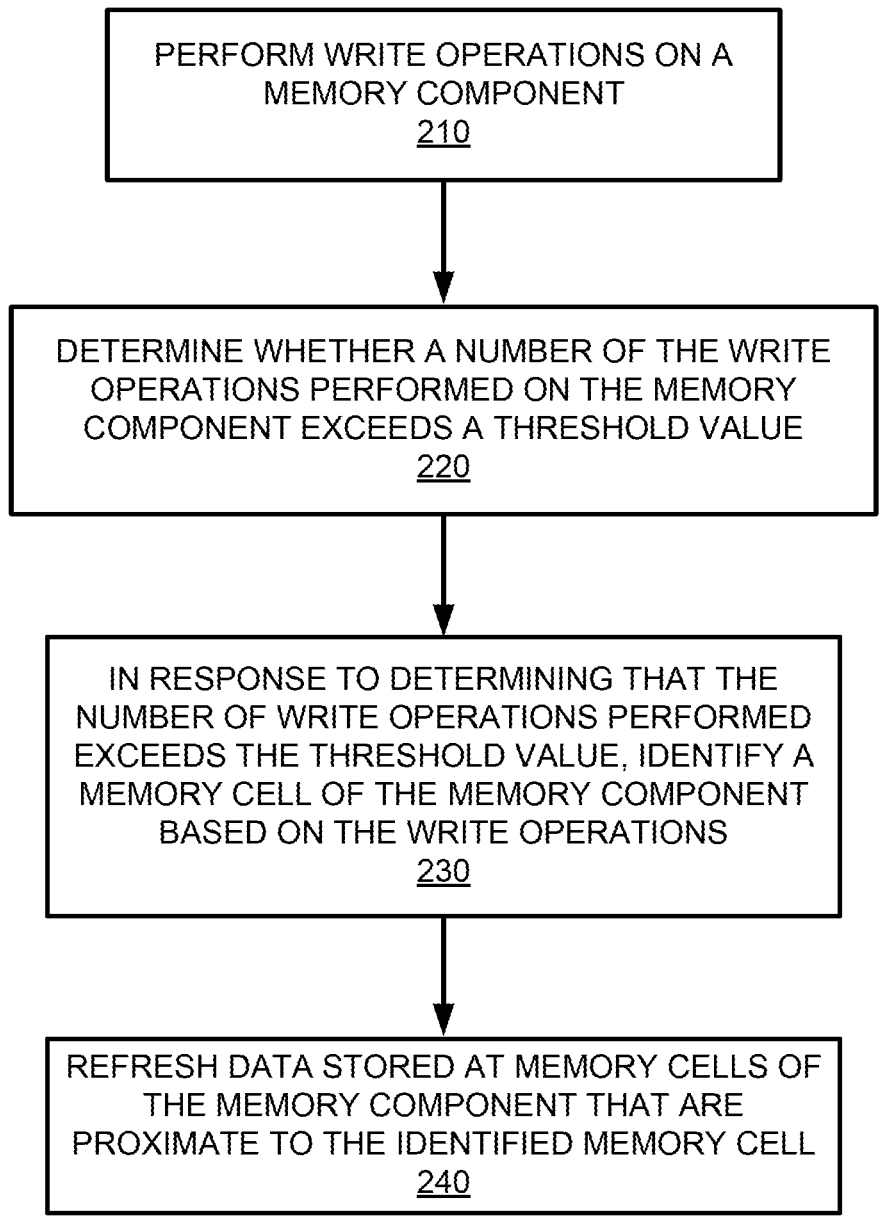
FIG. 2 is a flow diagram of an example method to refresh data stored at memory cells of a memory component in response to a number of write operations performed on the memory component exceeding a threshold value, in accordance with some embodiments of the present disclosure.

FIG. 2 is a flow diagram of an example method 200 to refresh data stored at memory cells of a memory component in response to a number of write operations performed on the memory component exceeding a threshold value, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the disturb mitigating component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 210, the processing logic performs one or more write operations on a memory component. The write operations can include receiving user data from a host system and storing the user data at one or more memory cells of the memory component. At block 220, the processing logic determines whether a number of the write operations performed on the memory component exceeds a threshold value. The number of write operations performed on the memory component can correspond to write operations performed on any memory cell of the memory component rather than write operations performed on a particular managing unit of the memory component. Since the number of write operations is tracked on a memory component level rather than for each managing unit of the memory component, the amount of computing resources of the memory sub-system being dedicated to tracking the number of write operations is reduced. Although embodiments of the disclosure discuss tracking the number of write operations performed on a per memory component basis, in some embodiments the number of write operations can be the number of write operations performed on a memory sub-system.

The threshold value can correspond to the probability of a write disturb affecting data stored at one or more memory cells of the memory component. For example, if there is a high probability of write disturb affecting the data stored at the memory cells of the memory component after 1000 write operations are performed without refreshing the data, then the threshold value can be a number of write operations that is less than the 1000 write operations. In embodiments, to minimize the effects of write disturb on data stored at the memory component, the threshold value can include a factor of safety. For example, if there is a high probability that write disturb can affect data stored at the memory component after 1000 write operations have been performed on the memory component, then the threshold value can be set at 100 write operations performed on the memory component. Since the data stored at the memory component is refreshed more frequently (e.g., after 100 write operations) and the likelihood that write disturb affects data stored at one or more memory cells of the memory component is reduced.

The threshold value can be based on various characteristics associated with the memory component. One characteristic associated with the memory component can be the total number of write operations performed on the memory component. The total number of write operations performed on the memory component can correspond to the total number of write operations performed on the memory component during the lifetime of the memory component. As write operations are performed on memory cells of the memory component, the memory cells can degrade. The degradation of the memory cells causes data stored at the memory cells to be effected more quickly by write disturb stress. Accordingly, data stored at memory cells of a memory component having a higher number of write operations performed on the memory component are refreshed more often than memory cells of a memory component having a lower number of write operations performed on the memory component.

Another characteristic associated with the memory component can be the temperature of the memory component. As the temperature of the memory component increases, the probability that data stored at memory cells of the memory component are effected by write disturb increases. Therefore, data stored at memory cells of a memory component at a higher temperature can be refreshed more frequently than data stored at memory cells of a memory component at a lower temperature. Thus, the operating temperature of a memory sub-system that includes the memory component can be used to determine the threshold value of write operations.

A further characteristic associated with the memory component can be the drift time for data stored at a memory cell of the memory component. The drift time can correspond to an amount of time that has elapsed since the data was written to the memory cell. For example, if 24 hours has elapsed since the data was written to the memory cell, then the drift time is 24 hours. In embodiments, to track the drift time of memory cells of the memory component, the memory cells can be divided into managing units. When a write operation is performed on a memory cell of a particular managing unit or group of managing units, a timestamp corresponding to the time the write operation was performed (or other such indication of when the write operation was performed) can be generated and assigned to the particular managing unit or group of managing units. In embodiments, the timestamp can correspond to the most recent time that a write operation was performed on a memory cell of a managing unit or group of managing units. In some embodiments, the timestamp can correspond to the least recent time that a write operation was performed on a memory cell of a managing unit or group of managing units. As the drift time for data stored at a managing unit or group of managing units increases, the probability that write disturb will affect data stored at memory cells of the managing unit or group of managing units also increases. Therefore, data stored at memory cells of a managing unit or group of managing units having a higher drift time can be refreshed more frequently than memory cells of a managing unit or group of managing units having a lower drift time.

Another characteristic associated with the memory component can be die-to-die variation. The dies of a memory component of multiple memory components can exhibit different characteristics and performance that are a result of variations in the composition of the dies due to the manufacturing process of the memory component. Accordingly, some dies of the memory component can store data more reliably (e.g., require less error correction operations) than other dies of the memory component. Upon reading data from the different dies of the memory component, an error rate associated with the data can be determined and utilized to identify weak dies. A weak die can correspond to a die having an error rate that exceeds a threshold value. For example, if the threshold value for error rate is 250 errors per million bits of data read from a die and data read from a particular die is determined to have 300 errors per million bits of data read, then the particular die can be identified as being a weak die. Data stored at a weak die is more susceptible to being effected by write disturb stress. Accordingly, as the error rate associated with data stored at a die increases, the frequency at which the data stored at the die is refreshed also increases.

At block 230, the processing logic identifies a memory cell of the memory component based on the write operations performed at block 210. The processing logic identifies the memory cell in response to determining that the number of write operations performed exceeds the threshold value. For example, if the threshold value is 50 write operations and 50 write operations have been performed on the memory component, then the number of write operations exceeds the threshold value. In embodiments, the identified memory cell can correspond to the most recent memory cell that was written to during the one or more write operations performed at block 210. In some embodiments, the identified memory cell can correspond to any one of the memory cells written to during the one or more write operations performed at block 210. In an embodiment, the processing logic can determine whether the identified memory cell is associated with a recent refresh operation and identify another memory cell in response to the identified memory cell being associated with a recent refresh operation, as will be described in further detail below.

At block 240, the processing logic refreshes data stored at one or more memory cells of the memory component that are proximate to the identified memory cell. The one or more proximate memory cells can correspond to memory cells that are adjacent to the identified memory cell. Refreshing the data stored at the one or more memory cells of the memory component can include reading the data stored at the one or more memory cells and writing the data back to the one or more memory cells. By refreshing the data stored at the one or more memory cells, the effects of write disturb stress on the data stored at the one more memory cells caused by the write operation performed on the identified memory cell can be mitigated. In embodiments, upon refreshing the data stored at the one or more memory cells of the memory component, a counter for the number of write operations performed on the memory component can be reset to zero.

In an embodiment, upon refreshing the data stored at the one or more memory cells of the memory component, the processing logic can store information associated with the refresh operation in a data structure at the memory subsystem. Examples of information associated with the refresh operation can include a timestamp that corresponds to the time of performance of the refresh operation, the total number of write operations performed on the memory component at the time of performance of the refresh operation and identifying information of the memory cells, such as physical address information.

Figure 3:
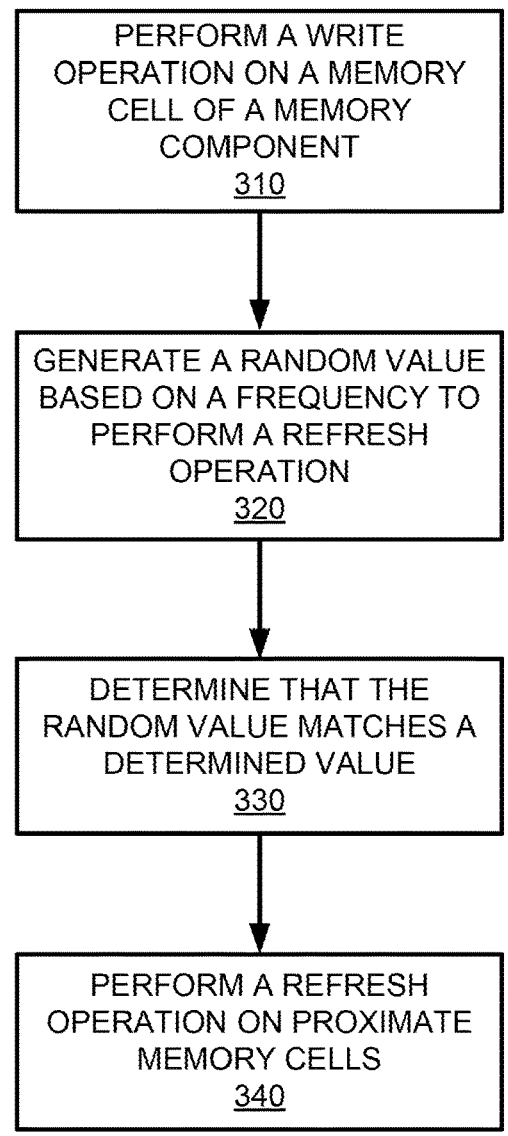
FIG. 3 is a flow diagram of an example method to perform a refresh operation on proximate memory cells based on a generated random value, in accordance with some embodiments of the present disclosure.

FIG. 3 is a flow diagram of an example method 300 to perform a refresh operation on proximate memory cells based on a generated random value, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the disturb mitigating component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 310, the processing logic performs a write operation on a memory cell of a memory component. At block 320, upon performing a write operation on the memory cell of the memory component, the processing logic generates a random value that is based on a frequency to perform a refresh operation. The frequency can be based on the probability of write disturb affecting data stored at memory cells of the memory component, as previously described in FIG. 2. The random value can be any integer from a range of values, where the lower bound of the range of values can be zero and the upper bound of the range of values is based on the frequency. For example, if the frequency indicates that a refresh operation is to be performed after 20 write operations, then the lower bound of the range of random values can be zero and the upper bound of the range of random values can be 19. This results in a range of values (e.g., 0 to 19) that includes 20 integers, which corresponds to the frequency to perform a refresh operation.

At block 330, the processing logic determines that the random value matches a determined value. The determined value can be any one of the integers within the range of values based on the determined frequency. For example, if the range of values is 0 to 19, then the determined value can be any integer between 0 and 19. If the determined value matches the generated value at block 320, then the memory cell associated with the write operation at block 310 can be identified for a refresh operation. In embodiments, if the processing logic determines that the random value does not match the determined value, then a memory cell is not identified for a refresh operation and a subsequent operation (e.g., read or write operation) can be performed on the memory component.

At block 340, in response to determining that the determined value matches the generated random value, the processing logic performs a refresh operation on memory cells that are proximate to the identified memory cell. The refresh operation can mitigate the effects of write disturb on data stored at the proximate memory cells caused by the write operation performed on the identified memory cell at block 310.

Referring to FIG. 3, by utilizing a generated random value to determine whether a refresh operation is performed after the performance of a write operation, the memory subsystem no longer tracks the number of write operations performed on the memory component, as previously described in FIG. 2. Instead, each time a write operation is performed on a memory component, there is a probability that a refresh operation can be performed based on the determined frequency. For example, if the range of random values is 0 to 19, then there is a 5% (e.g., 1 out of 20) probability that a refresh operation will be performed. Therefore, rather than refreshing data after 20 write operations have been performed on the memory component, each time a write operation is performed on the memory component there is a 5% probability that the refresh operation will be performed. Since the number of write operations performed on the memory component is no longer tracked, the amount of computing resources of the memory sub-system dedicated to tracking the number of write operations can be reduced or eliminated. This results in an increase in the performance of the memory sub-system.

Figure 4:
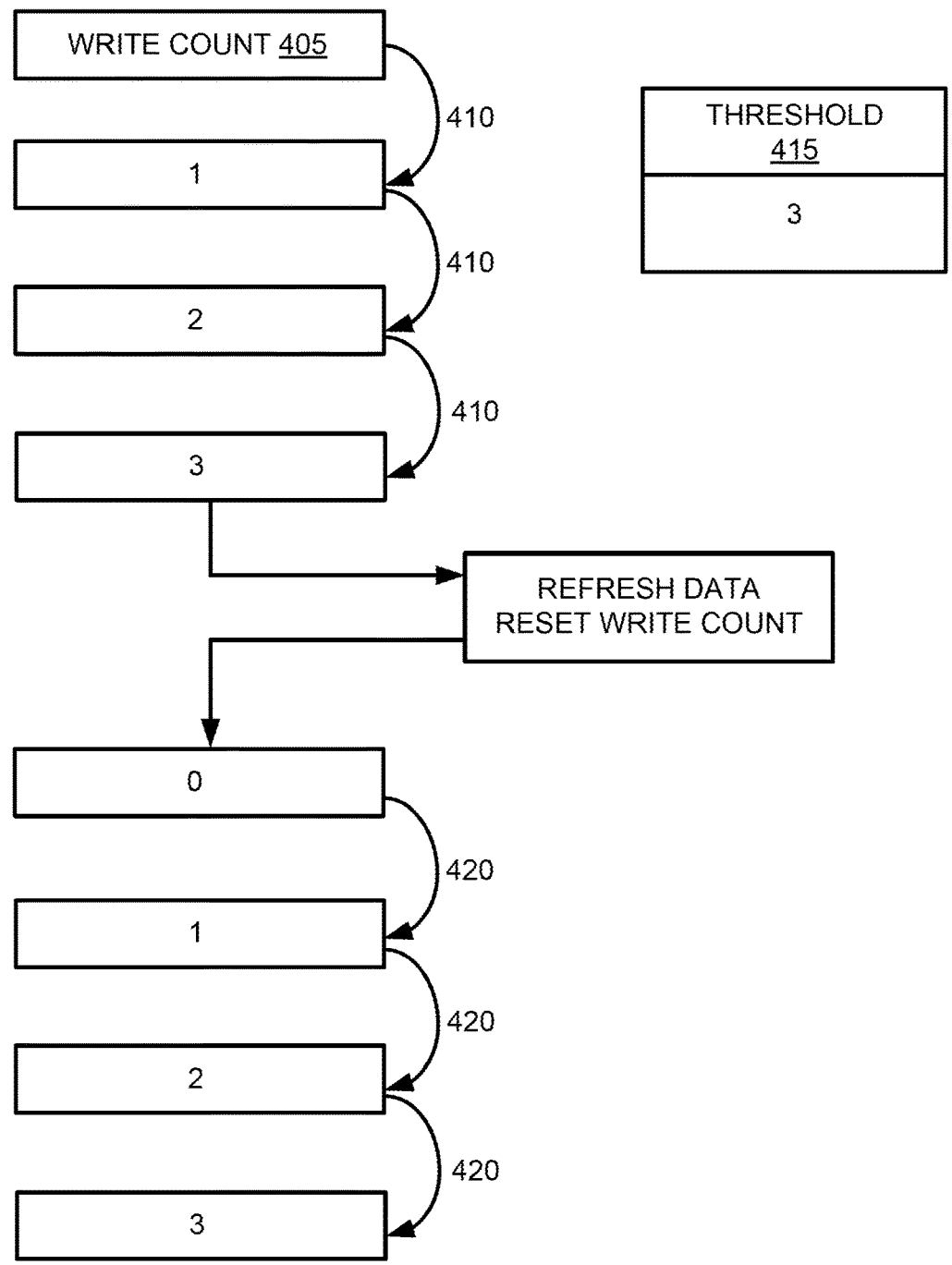
FIG. 4 is an illustration of refreshing data based on a number of write operations performed on a memory component of a memory sub-system, in accordance with embodiments of the disclosure.

FIG. 4 is an illustration 400 of refreshing data based on a number of write operations performed on a memory component of a memory sub-system, in accordance with embodiments of the disclosure. Illustration 400 includes a write count 405 that corresponds to a number of write operations performed on a memory component of a memory sub-system. In embodiments, the write count 405 can correspond to the number of write operations performed on the memory component without an intervening write or refresh operation. Illustration 400 further includes a threshold value 415 that can correspond to the threshold value as previously discussed at block 220 of FIG. 2.

Referring to FIG. 4, as each write operation 410 is performed on the memory component, the write count 405 is incremented. Once the write count 405 exceeds the threshold value 415 of 3, a refresh operation is performed on data stored at the memory component and the write count 405 can be reset to zero. Upon completion of the refresh operation, subsequent write operations 420 can be performed on the memory component. Each time a subsequent write operation 420 is performed on the memory component, the write count 405 can be incremented, as previously described.

FIG. 5A is an illustration 500 of determining to not perform a refresh operation based on determining that a determined value and a random value do not match, in accordance with some embodiments of the disclosure. At block 505, a write operation is performed on a memory component. Upon performing the write operation on the memory component, a random value is generated as previously described at block 320 of FIG. 3. The memory sub-system can determine whether the generated random value matches a determined value. If the generated random value matches the determined value, then a refresh operation can be performed. If the generated random value does not match the determined value, then a refresh operation is not performed.

Referring to FIG. 5A, the determined value 510 is 0 and the random value 515 that was generated is 14. Since the determined value 510 and the random value 515 do not match, at block 520 the memory sub-system can determine to not perform a refresh operation on the memory component.

FIG. 5B is an illustration 550 of determining to perform a refresh operation based on determining a determined value and a random value match, in accordance with some embodiments of the disclosure. At block 555, a write operation is performed on a memory component. Upon performing the write operation on the memory component, a random value is generated as previously described at block 320 of FIG. 3.

Referring to FIG. 5B, the determined value 560 is 0 and the random value 565 that was generated is 0. Since the determined value 560 and the random value 565 match, at block 570 the memory sub-system can perform a refresh operation on the memory component.

FIG. 6A illustrates determining whether to adjust the threshold value for performing a refresh operation on memory components of a memory sub-system 600, in accordance with an embodiment of the disclosure. The memory sub-system 600 can include memory components 605, 610, 630. Each of memory components 605, 610, 630 have an associated drift time (e.g., DRIFT), temperature (e.g., TEMP.), threshold value (e.g., THRESH.), and total number of write operations performed on the memory component (e.g., WRITE OPS.) The threshold value can correspond to the threshold value as previously described at block 220 of FIG. 2 or the frequency as previously described at block 320 of FIG. 3. The total number of write operations performed on the memory component can correspond to the total number of write operations performed on the memory component during the lifetime of the memory component.

As previously described, the threshold value for a memory component can be determined based on various characteristics of the memory component. Accordingly, as the characteristics of the memory component change, the threshold value that determines how often a refresh operation is performed on a memory component can be adjusted. For example, when the total number of write operations performed on a memory component over the lifetime of the memory component exceeds a write threshold, the threshold value to perform a refresh operation can be decreased. By decreasing the threshold value, the refresh operation can be performed on the memory component more often to mitigate the effects of write disturb stress. In embodiments, the threshold value can be dynamically adjusted. For example, as the total number of write operations performed on the memory component during the lifetime of the memory component increases, the threshold value can be decreased.

The memory sub-system 600 can include a write threshold 615 that corresponds to the total number of write operations performed on a memory component. When the total number of write operations for a particular memory component exceeds the write threshold 615, the memory sub-system 600 can adjust the threshold value for the particular memory component. The memory sub-system 600 can further include a temperature threshold 620 that corresponds to a temperature of a memory component. When the temperature of a particular memory component exceeds the temperature threshold 620, the memory sub-system 600 can adjust the threshold value for the particular memory component. Additionally, the memory sub-system 600 can include a drift threshold 625 that corresponds to the drift time of a memory component. When the drift time of a particular memory component, or managing unit of a particular memory component, exceeds the drift threshold 620, the memory sub-system 600 can adjust the threshold value for the particular memory component.

Referring to FIG. 6A, memory component 605 has a drift time of 5 hours, a temperature of 125 degrees Celsius, a threshold value of 100 and a total number of write operations of 100,000. Since the drift time, temperature and total number of write operations of memory component 605 do not exceed the drift threshold 625, the write threshold 615 or the temperature threshold 620, the memory sub-system 600 can determine to not adjust the threshold value for memory component 605. Memory component 610 has a drift time of 7 hours, a temperature of 150 degrees Celsius, a threshold value of 110 and a total number of write operations of 75,000. Since the drift time, temperature and total number of write operations of memory component 610 do not exceed the drift threshold 625, the write threshold 615 or the temperature threshold 620, the memory sub-system 600 can determine to not adjust the threshold value for memory component 610. Memory component 630 has a drift time of 18 hours, a temperature of 120 degrees Celsius, a threshold value of 130 and a total number of write operations of 50,000. Since the drift time, temperature and total number of write operations of memory component 630 do not exceed the drift threshold 625, the write threshold 615 or the temperature threshold 620, the memory sub-system 600 can determine to not adjust the threshold value for memory component 630.

FIG. 6B illustrates adjusting the threshold value for performing a refresh operation on memory components of a memory sub-system 650, in accordance with an embodiment of the disclosure. In FIG. 6B, the total number of write operations performed on memory component 605 has increased to 151,000. Since the total number of write operations performed on memory component 605 exceeds the write threshold 615 of 150,000, the threshold value for memory component 605 can be adjusted from 100 to 50. This results in refresh operations being performed more frequently (e.g., after 50 write operations are performed) on memory component 605. The temperature of memory component 610 has increased from 150 degrees Celsius to 220 degrees Celsius. Since the temperature of memory component 610 exceeds the temperature threshold 620, the threshold value for memory component 610 can be adjusted from 110 to 60. The drift time of memory component 63 has increased from 18 hours to 25 hours. Since the drift time of memory component 630 exceeds the drift threshold 625, the threshold value for memory component 630 can be adjusted from 130 to 70.

Although FIGS. 6A and 6B illustrate adjusting the threshold value based on the characteristics of temperature and total number of write operations performed on the memory component, in embodiments the threshold value can be adjusted based on other characteristics associated with the memory component. For example, if the drift time for data stored on a memory component exceeds a threshold, the threshold value can be decreased. In another example, if a particular die of a memory component is identified as being a weak die (e.g., having an associated error rate for data stored at the die that exceeds a threshold), then the threshold value can be decreased. In some embodiments, multiple threshold values can be assigned to different portions of a single memory component based on characteristics associated with the different portions. For example, if a particular managing unit of a memory component has a higher drift time than another managing unit of the memory component, then the particular managing unit having the higher drift time can be assigned a lower threshold value than another managing unit having a lower drift time.

In embodiments, the memory sub-system can utilize multiple thresholds for one or more characteristics associated with a memory component. For example, a first temperature threshold and second temperature threshold can be utilized as lower and upper bounds for adjusting the threshold value of a memory component. If the temperature of the memory component drops below the first temperature threshold, the threshold value for the memory component can be increased so that the refresh operation is performed less often. If the temperature of the memory component exceeds the second temperature threshold, the threshold value for the memory component can be decreased so that the refresh operation is performed more often.

Figure 7:
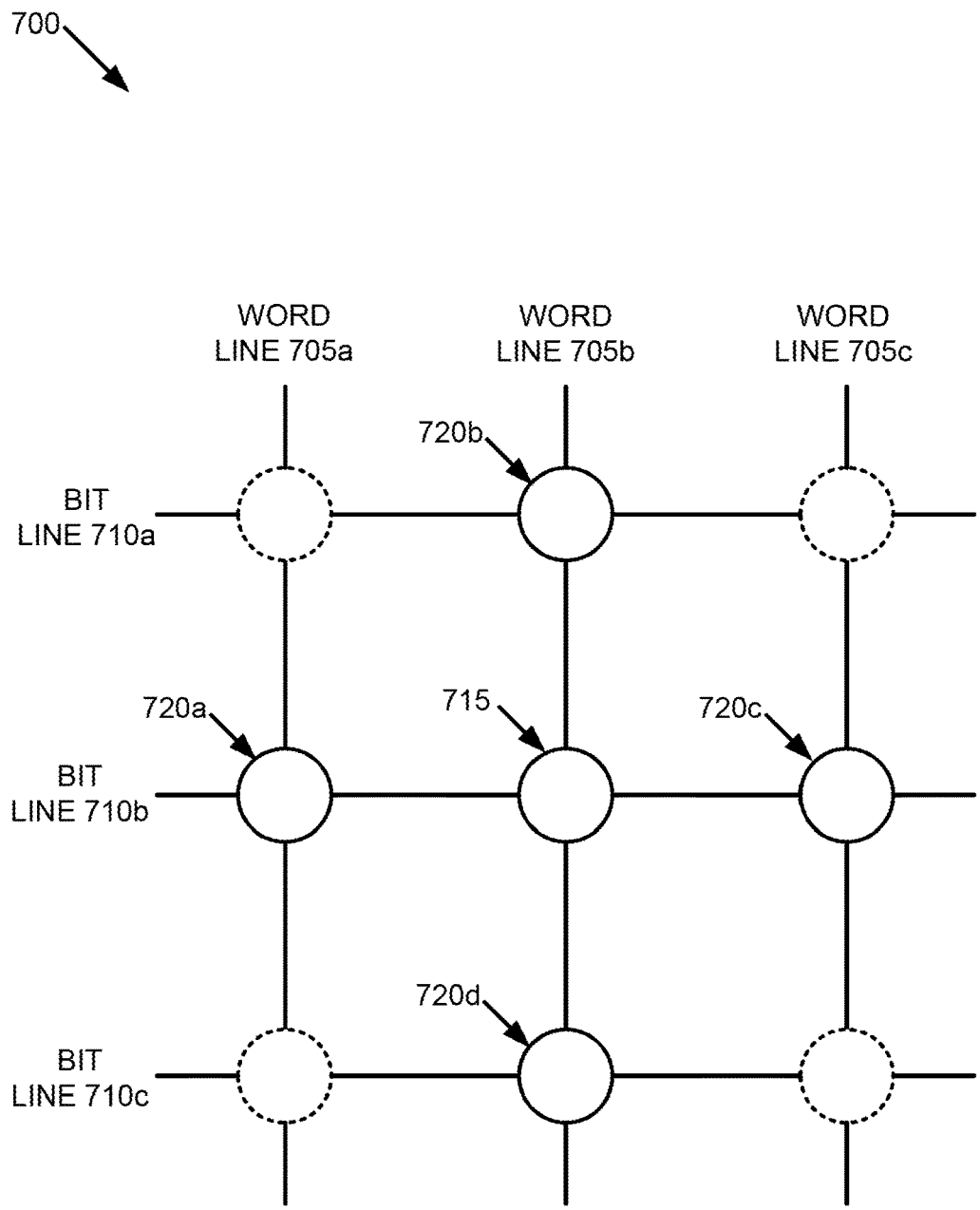
FIG. 7 is an illustration of memory cells that are proximate to an identified memory cell of a memory component, in accordance with embodiments of the disclosure.

FIG. 7 is an illustration of memory cells that are proximate to an identified memory cell of a memory component 700, in accordance with embodiments of the disclosure. Memory component 700 includes word lines 705a-c and bit lines 710a-c. Memory cells, such as memory cells 715 and 720a-d, are located at the intersection of each of word lines 705a-c and bit lines 710a-c. When a write operation is performed on a memory cell, write disturb stress can affect data stored at memory cells that are proximate to the memory cell that the write operation was performed on. For example, if a write operation is performed on memory cell 715, then write disturb can affect data stored at memory cells 720a-d.

Therefore, to mitigate the effects of write disturb caused by a write operation performed on a particular memory cell, the particular memory cell can be identified as previously described at block 230 of FIG. 2. Upon identifying the particular memory cell, a refresh operation can be performed on the memory cells that are proximate to the identified memory cell. For example, if memory cell 715 is identified based on a write operation that has been performed on memory cell 715, then a refresh operation can be performed to refresh the data stored at memory cells 720a-d to mitigate the effects of write disturb stress on the data stored at memory cells 720a-d.

Figure 8:
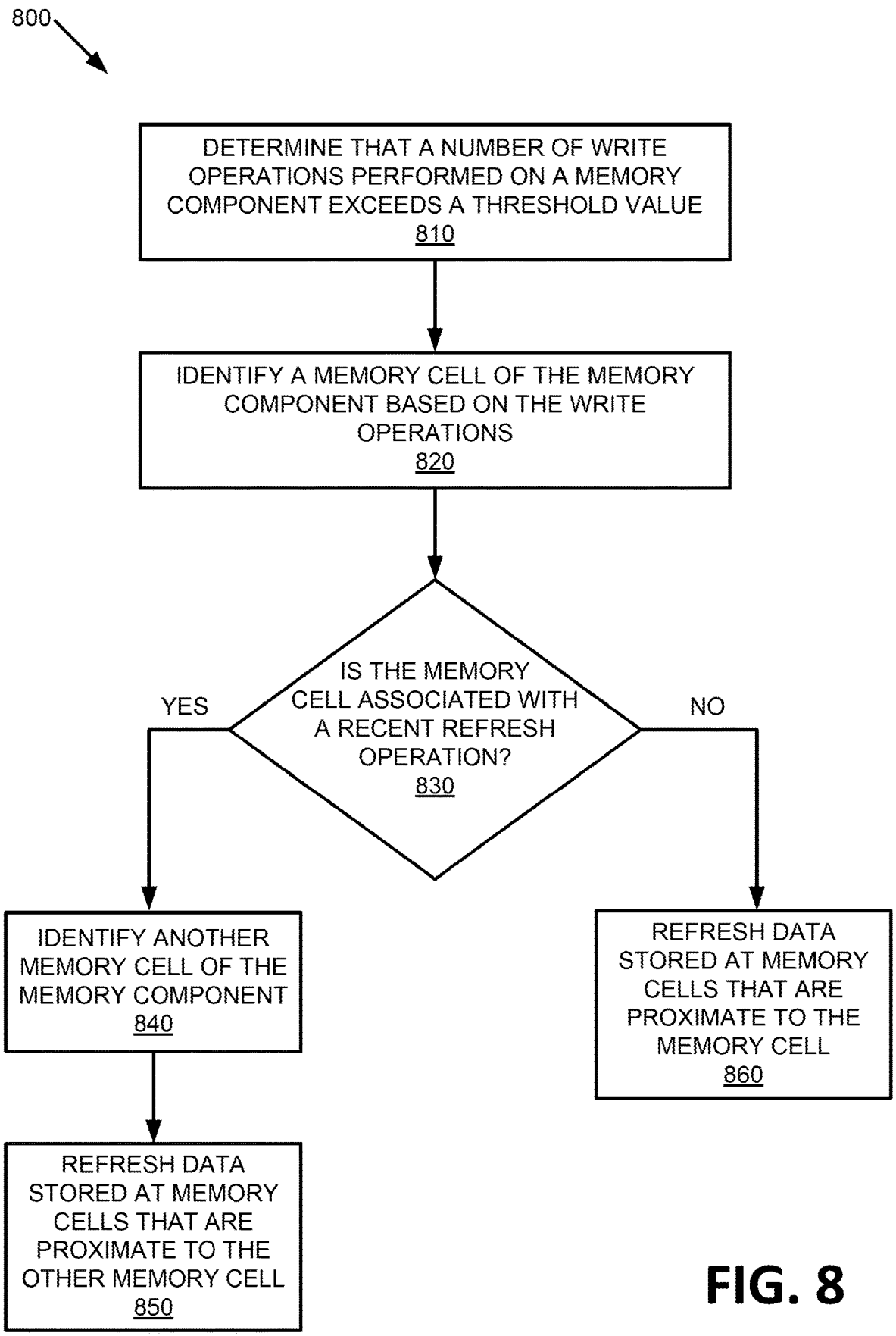
FIG. 8 is a flow diagram of an example method to determine whether an identified memory cell is associated with a recent refresh operation, in accordance with some embodiments of the present disclosure.

FIG. 8 is a flow diagram of an example method 800 to determine whether an identified memory cell is associated with a recent refresh operation, in accordance with some embodiments of the present disclosure. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the disturb mitigating component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 810, the processing logic determines that a number of write operations performed on a memory component exceeds a threshold value. At block 820, the processing logic identifies a memory cell of the memory component based on the write operations.

At block 830, the processing logic determines if the memory cell is associated with a recent refresh operation. In embodiments, a memory cell can be associated with a recent refresh operation based on an amount of time that has elapsed since a refresh operation has been performed on the identified memory cell being less than a threshold amount of time. For example, if the threshold amount of time for a recent refresh operation is 24 hours and a refresh operation has been performed on the memory cell 16 hours ago, then the memory cell is associated with a recent refresh operation. In an embodiment, a memory cell can be associated with a recent refresh operation based on a number of write operations that have been performed on the memory component since a refresh operation has been performed on the memory cell exceeding a threshold. For example, if the threshold number of write operations is 1,000 write operations and 500 write operations have been performed on the memory component since a refresh operation has been performed on the memory cell, then the memory cell is associated with a recent refresh operation.

As previously described in FIG. 2, upon completion of a refresh operation, information associated with the refresh operation can be stored in a data structure at the memory sub-system. The processing logic can determine whether an identified memory cell is associated with a recent refresh operation by querying the data structure for information associated with refresh operations for the identified memory cell.

If the identified memory cell is determined to be associated with a recent refresh operation, then at block 840, the processing logic identifies another memory cell of the memory component. The other memory cell can be based on the write operations performed on the memory component. For example, if the memory cell identified at block 820 is associated with the most recent write operation, then the other memory call can be the second most recent write operation of the write operations performed on the memory component. In embodiments, the other memory cell can be associated with any of the write operations performed on the memory component. Upon identifying the other memory cell of the memory component, at block 850 the processing logic refreshes the data stored at one or more memory cells that are proximate to the other memory cell.

If the identified memory cell is determined to not be associated with a recent refresh operation, then at block 860 the processing logic refreshes the data stored at one or more memory cells that are proximate to the identified memory cell.

Figure 9:
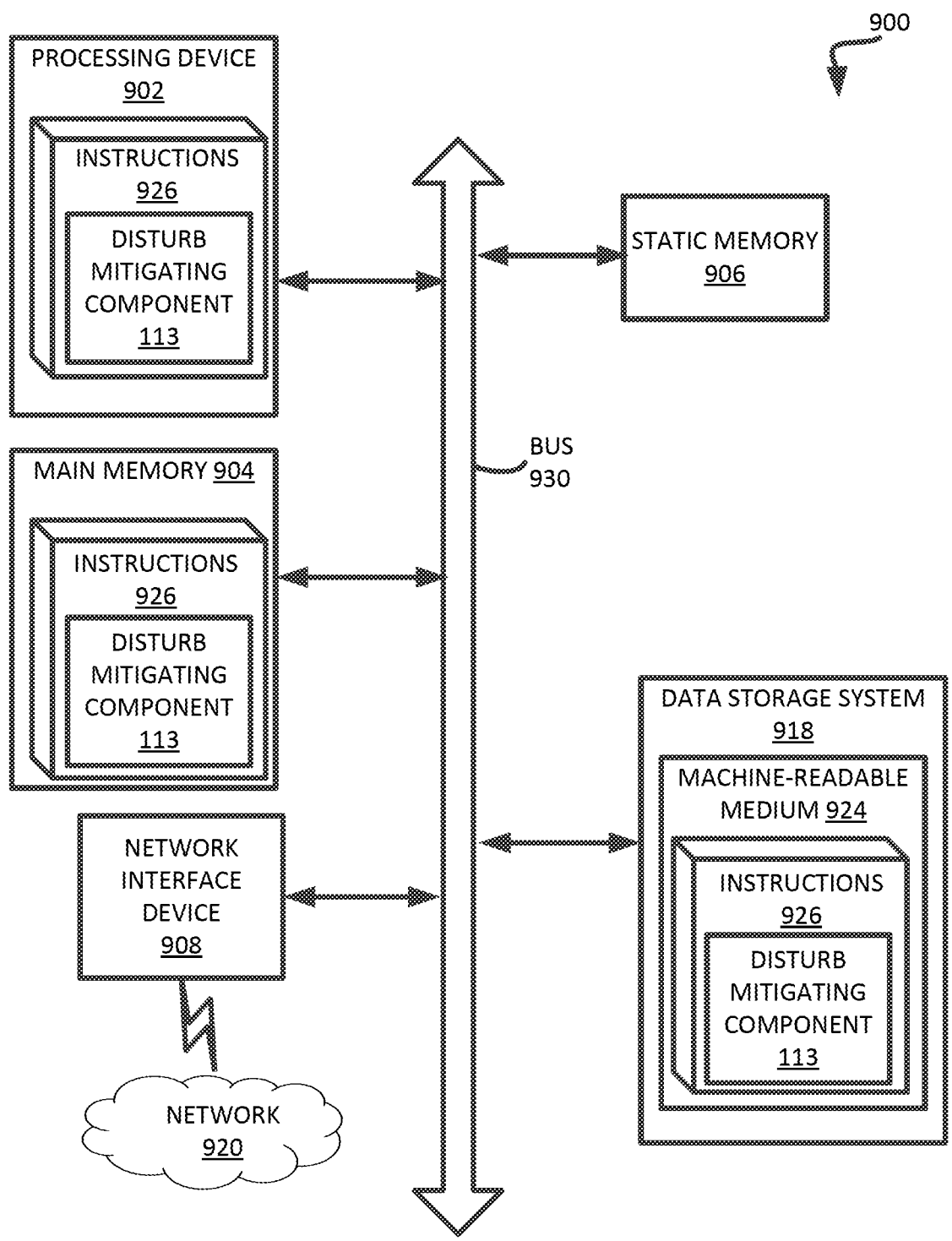
FIG. 9 is a block diagram of an example computer system in which implementations of the present disclosure can operate.

FIG. 9 illustrates an example machine of a computer system 900 within which a set of instructions, for causing the machine to perform any one or more of the methodologies discussed herein, can be executed. In some embodiments, the computer system 900 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the disturb mitigating component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a data storage system 918, which communicate with each other via a bus 930.

Processing device 902 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 can also be one or more special-purpose processing devices such as an application specific integrated circuit (ASIC), a field programmable gate array (FPGA), a digital signal processor (DSP), network processor, or the like. The processing device 902 is configured to execute instructions 926 for performing the operations and steps discussed herein. The computer system 900 can further include a network interface device 908 to communicate over the network 920.

The data storage system 918 can include a machine-readable storage medium 924 (also known as a computer-readable medium) on which is stored one or more sets of instructions 926 or software embodying any one or more of the methodologies or functions described herein. The instructions 926 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage system 918, and/or main memory 904 can correspond to the memory sub-system 110 of FIG. 1.

In one embodiment, the instructions 926 include instructions to implement functionality corresponding to a disturb mitigating component (e.g., the disturb mitigating component 113 of FIG. 1). While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory component; and
a processing device, operatively coupled to the memory component, to:
perform a plurality of write operations on the memory component;
identify a temperature associated with the memory component;
determine whether the temperature associated with the memory component satisfies a temperature threshold value;
in response to determining that the temperature associated with the memory component satisfies the temperature threshold value, adjust a threshold value;
determine whether a number of the plurality of write operations performed on the memory component since performance of a refresh operation on the memory component exceeds the adjusted threshold value;
in response to determining that the number of write operations performed on the memory component exceeds the adjusted threshold value, identify a memory cell of the memory component based on the plurality of write operations; and
refresh data stored at a plurality of memory cells of the memory component that are proximate to the identified memory cell.

2. The system of claim 1, wherein the adjusted threshold value is determined based on a probability of a write disturb affecting data stored at the memory component.

3. The system of claim 1, wherein the identified memory cell is associated with a most recent write operation of the plurality of write operations.

4. The system of claim 1, wherein the memory component comprises a cross-point array.

5. The system of claim 1, wherein the processing device is further to:
read other data stored at the memory component;
determine that an error rate associated with the other data stored at the memory component exceeds an error rate threshold, wherein the threshold value is further adjusted in response to determining that the error rate associated with the other data stored at the memory component exceeds the error rate threshold.

6. The system of claim 1, wherein the processing device is further to:
determine whether a total number of write operations performed on the memory component exceeds a write operation threshold value, wherein the threshold value is further adjusted in response to determining that the total number of write operations performed on the memory component exceeds the write operation threshold value.

7. The system of claim 1, wherein the processing device is further to:
identify a drift time associated with the memory component;
determine that the drift time associated with the memory component exceeds a drift time threshold, wherein the threshold value is further adjusted;
in response to determining that the drift time associated with the memory component exceeds the drift time threshold.

8. The system of claim 1, wherein the processing device is further to:
determine whether the identified memory cell of the memory component is associated with a recent refresh operation;
in response to determining that the identified memory cell of the memory component is associated with a recent refresh operation, identify another memory cell of the memory component; and
refresh data stored another plurality of memory cells of the memory component that are proximate to the other memory cell.

9. A method comprising:
performing a write operation on a memory component;
identifying a temperature associated with the memory component;
determining whether the temperature associated with the memory component satisfies a temperature threshold value;
in response to determining that the temperature associated with the memory component satisfies the temperature threshold value, adjusting a frequency to perform a refresh operation;
generating a random value based on the adjusted frequency to perform the refresh operation;
determining, by a processing device, whether the generated random value matches a determined value;

in response to determining that the generated random value matches the determined value, identifying a memory cell of the memory component;

performing a refresh operation on a plurality of memory cells of the memory component that are proximate to the identified memory cell.

10. The method of claim 9, further comprising:

reading data stored at the memory component;

determine that an error rate associated with the data stored at the memory component exceeds an error rate threshold, wherein the frequency is further adjusted; in response to determining that the error rate associated with the data stored at the memory component exceeds the error rate threshold.

11. The method of claim 9, further comprising:

determining whether a total number of write operations performed on the memory component exceeds a write operation threshold value, wherein the frequency is further adjusted in response to determining that the total number of write operations performed on the memory component exceeds the write operation threshold value.

12. The method of claim 9, further comprising:

identifying a drift time associated with the memory component;

determining that the drift time associated with the memory component exceeds a drift time threshold, wherein the frequency is further adjusted in response to determining that the drift time associated with the memory component exceeds the drift time threshold, adjusting the frequency.

13. The method of claim 9, further comprising:

determining whether the identified memory cell of the memory component is associated with a recent refresh operation;

in response to determining that the identified memory cell of the memory component is associated with a recent refresh operation, identifying another memory cell of the memory component; and refreshing data stored another plurality of memory cells of the memory component that are proximate to the other memory cell.

14. A non-transitory computer-readable storage medium comprising instructions that, when executed by a processing device, cause the processing device to:

perform a plurality of write operations on a memory component;

identify a temperature associated with the memory component;

determine whether the temperature associated with the memory component satisfies a temperature threshold value;

in response to determining that the temperature associated with the memory component satisfies the temperature threshold value, adjust a threshold value;

determine whether a number of the plurality of write operations performed on the memory component since performance of a refresh operation on the memory component exceeds the adjusted threshold value;

in response to determining that the number of write operations performed on the memory component exceeds the adjusted threshold value, identify a memory cell of the memory component based on the plurality of write operations; and refresh data stored at a plurality of memory cells of the memory component that are proximate to the identified memory cell.

15. The non-transitory computer-readable storage medium of claim 14, wherein the adjusted threshold value is determined based on a probability of a write disturb affecting data stored at the memory component.

16. The non-transitory computer-readable storage medium of claim 14, wherein the processing device is further to:

read other data stored at the memory component;

determine that an error rate associated with the other data stored at the memory component exceeds an error rate threshold, wherein the threshold value is further adjusted in response to determining that the error rate associated with the other data stored at the memory component exceeds the error rate threshold.

17. The non-transitory computer-readable storage medium of claim 14, wherein the processing device is further to:

determine whether a total number of write operations performed on the memory component exceeds a write operation threshold value, wherein the threshold value is further adjusted in response to determining that the total number of write operations performed on the memory component exceeds the write operation threshold value.

18. The non-transitory computer-readable storage medium of claim 14, wherein the processing device is further to:

identify a drift time associated with the memory component;

determine that the drift time associated with the memory component exceeds a drift time threshold, wherein the threshold value is further adjusted in response to determining that the drift time associated with the memory component exceeds the drift time threshold.

* * * * *